US010615817B2

(12) United States Patent
Downey

(10) Patent No.: US 10,615,817 B2
(45) Date of Patent: Apr. 7, 2020

(54) CURRENT STEERING DIGITAL TO ANALOG CONVERTER

(71) Applicant: Analog Devices Global Unlimited Company, Hamilton (BM)

(72) Inventor: Fergus John Downey, Raheen (IE)

(73) Assignee: Analog Devices Global Unlimited Company, Hamilton (BM)

( * ) Notice: Subject to any disclaimer, the term of this patent is extended or adjusted under 35 U.S.C. 154(b) by 0 days.

(21) Appl. No.: 15/895,661

(22) Filed: Feb. 13, 2018

(65) Prior Publication Data

US 2019/0140656 A1 May 9, 2019

(30) Foreign Application Priority Data

Nov. 7, 2017 (GB) .................... 1718403.7

(51) Int. Cl.
*H03M 1/66* (2006.01)
*H03M 1/78* (2006.01)
(Continued)

(52) U.S. Cl.
CPC .......... *H03M 1/785* (2013.01); *H03M 1/0612* (2013.01); *H03M 1/742* (2013.01); *H03M 1/78* (2013.01)

(58) Field of Classification Search
CPC ...... H03M 1/745; H03M 1/742; H03M 1/747; H03M 1/66; H03M 1/765; H03M 1/68; H03M 1/682; H03M 3/502; H03M 1/0604; H03M 1/0863; H03M 1/00; H03M 1/0624; H03M 1/0682; H03M 1/12; H03M 1/687
(Continued)

(56) References Cited

U.S. PATENT DOCUMENTS 3,940,760 A 2/1976 Brokaw
4,308,467 A * 12/1981 Kolluri .................. H03M 1/785
327/427
(Continued)

FOREIGN PATENT DOCUMENTS

EP 0447833 A2 9/1991
EP 0541163 A2 5/1993
(Continued)

OTHER PUBLICATIONS

Bult, Klaas, et al, "An Inherently Linear and Compact MOST-Only Current Division Technique", IEEE Journal of solid-state circuits, vol. 27, No. 12, (Dec. 1992), 6 pgs.
(Continued)

*Primary Examiner* — Linh V Nguyen
(74) *Attorney, Agent, or Firm* — Schwegman Lundberg & Woessner, P.A.

(57) ABSTRACT

Digital to analog converter architectures are disclosed that enable the binary scaling of transistor sized to be replaced by transistors of substantially the same size. This significantly reduced the size of the Digital to Analog converter on a wafer. As the currents from the lesser bits of the converter may be very small indeed, some of the transistors are operated in a regime where the gate-source voltage applied to the transistor is below the threshold voltage for the device, the threshold voltage generally being regarded as marking the onset of significant conduction through a field effect transistor.

26 Claims, 10 Drawing Sheets

(51) Int. Cl.
*H03M 1/06* (2006.01)
*H03M 1/74* (2006.01)

(58) Field of Classification Search
USPC .............................. 341/144, 153, 154, 136
See application file for complete search history.

(56) References Cited

U.S. PATENT DOCUMENTS

| | | | |
|---|---|---|---|
| 4,349,811 A | 9/1982 | Brokaw | |
| 5,119,094 A | 6/1992 | Brokaw | |
| 6,052,074 A * | 4/2000 | Iida | H03M 1/123 |
| | | | 341/135 |
| 6,608,577 B2 * | 8/2003 | Nishimura | H03M 1/68 |
| | | | 341/144 |
| 6,958,719 B2 * | 10/2005 | Moon | H03M 1/687 |
| | | | 341/135 |
| 7,068,201 B1 * | 6/2006 | Chou | H03M 1/0602 |
| | | | 341/144 |
| 7,173,553 B2 * | 2/2007 | Ohmi | H03M 1/687 |
| | | | 341/144 |
| 9,264,062 B1 * | 2/2016 | Kabir | G01S 7/352 |
| 9,300,318 B1 * | 3/2016 | Medina Sanchez-Castro | |
| | | | H03M 1/0863 |
| 9,819,357 B1 * | 11/2017 | Guo | H03M 1/0607 |
| 9,991,900 B1 * | 6/2018 | Kabir | H03M 1/067 |
| 2003/0001765 A1 * | 1/2003 | Bright | H03M 1/0604 |
| | | | 341/145 |
| 2006/0061499 A1 * | 3/2006 | Seo | H03K 17/04106 |
| | | | 341/144 |
| 2007/0085721 A1 | 4/2007 | Moosa et al. | |
| 2007/0090981 A1 * | 4/2007 | Chou | H03M 1/68 |
| | | | 341/144 |
| 2009/0128387 A1 * | 5/2009 | Lu | H03M 1/682 |
| | | | 341/154 |
| 2009/0184855 A1 * | 7/2009 | Tokumaru | H03M 1/002 |
| | | | 341/144 |
| 2010/0321223 A1 * | 12/2010 | Imai | G05F 3/262 |
| | | | 341/150 |
| 2011/0050470 A1 * | 3/2011 | Kimura | H03M 1/745 |
| | | | 341/136 |

FOREIGN PATENT DOCUMENTS

| | | |
|---|---|---|
| EP | 0454841 B1 | 10/1997 |
| WO | WO-2017019973 A1 | 2/2017 |

OTHER PUBLICATIONS

Gupta, Shantanu, et al., "W-2W Current Steering DAC for Programming Phase Change Memory", Boise State University Dpt of Electrical and Computer Engineering, (accessed Feb. 8, 2018), 4 pgs.

Kamel, AMR Ahmed, et al., "A 1.6-nA Quiescent Current Bandgap Reference in 130-nm CMOS Technology", ResearchGate Conference Paper, (Dec. 2015), 5 pgs.

Osaki, Yuji, et al., "A 95-nA, 523ppm/° C, 0.6-??WCMOS Current Reference Circuit with Subthreshold MOS Resistor Ladder", Department of Electrical and Electronic Engineering, Kobe University, (accessed Feb. 8, 2018), 2 pgs.

"Reissued Search and Examination Report GB 1718403.7 dated May 9, 2018", 5 pages.

"Search and Examination Report GB 1718403.7 dated May 9, 2018", 5 pages.

"International Application Serial No. PCT EP2018 080172, International Search Report dated Apr. 30, 2019", 7 pgs.

"International Application Serial No. PCT EP2018 080172, Written Opinion dated Apr. 30, 2019", 10 pgs.

"International Application Serial No. PCT/EP2018/080172, Invitation to Pay Additional Fees and Partial Search Report dated Feb. 28, 2019", 15 pgs.

Greenley, B R, et al., "A 1.4V 10b CMOS DC DAC in 0.01mm<2>", Proc. Of the IEEE Intl. Soc. Conference, (Sep. 17, 2003), 237-238.

Laurent, Hili, "Broadband Low Power DAC—DAC Summary Report", ESA Technical Management, (Oct. 16, 2012), 30 pgs.

* cited by examiner

CURRENT STEERING DIGITAL TO ANALOG CONVERTER

CLAIM OF PRIORITY

This Application claims the benefit of priority to GB Application Number 1718403.7, filed Nov. 7, 2017, which is hereby incorporated by reference herein in its entirety.

FIELD OF THE DISCLOSURE

The present disclosure relates to a current steering digital to analog converter, DAC.

BACKGROUND

Several DAC architectures exist, with transistor based current steeling DAC's based on scaled current generators being a possible design. These designs can take up significant amounts of area on a die due to the need to maintain a constant scaling factor, such as a factor of two, between a plurality of current sources.

SUMMARY

According to the present disclosure there is provided digital to analog converter comprising a plurality of field effect transistors acting as current generators and arranged in an array. The transistors are operated at sub threshold gate-source voltages.

Advantageously the transistors are all similar in size. In this context it means that variation in transistor size across the whole array is comparable with the current ratio between adjacent current sources.

It is thus possible to provide physically smaller DACs.

In an embodiment an Nth transistor acting as a Nth current source has a degeneration resistor comprised of a first part that is only in a current flow path to the Nth transistor and has a value 2R and a second part which is in the current flow path with the Nth transistor and a further load that draws a current equal to the current passed by the Nth transistor and has a value of $R+(X_N-2)R$, where $X_N=(N\ln(2))/gmR))$.

Alternatively or in addition in some embodiments the digital to analog converter includes voltage modification devices formed by FETs arranged in an cascade such that each voltage modification device supplies current to a respective current generator and a subsequent voltage modification device and the transistors exhibit a change in an aspect ratio x between the transistors of the voltage modification devices and the current source transistors which is a function of a current division ratio D between stages and a process parameter m representing a sub-threshold slope factor, and is represented by $x=1/(1-\exp(-m*\ln(D)))$.

BRIEF DESCRIPTION OF THE FIGURES

Embodiments of the present disclosure will be described, by way of non-limiting example only, with reference to the accompanying Figures, in which.

DESCRIPTION OF EMBODIMENTS OF THE DISCLOSURE

Figure 1:
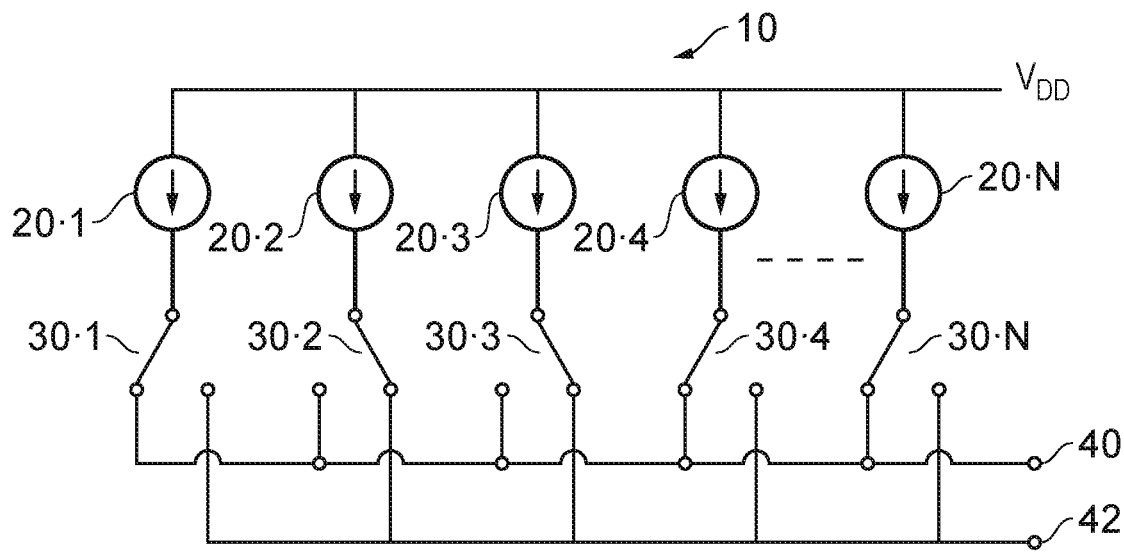
FIG. 1 is a schematic diagram of a current steering digital to analog converter.

FIG. 1 schematically illustrates a current steering DAC, generally designated 10. A plurality of current generators 20.1, 20.2, 20.3, 20.4 and so on to 20.N are arranged in series with respective current steering switches 30.1, 30.2, 30.3 to 30.N such that the currents from the current generators can be directed to a first node 40 or a second node 42, from where the current can be sunk by further components, not shown. The nodes 40 and 42 may be connected to virtual earths formed using operational amplifiers so as to hold nodes 40 and 42 at the same voltage irrespective of a value of a digital control word used to set the positions of the transistor switches 30.1 to 30.N.

The current generators may each generate the same current to provide a thermometer encoding scheme. In alternative arrangements the current generators may be weighted, for example binary weighted (other weighting schemes with a radix<2 are also possible) or both approaches can be used within the same device.

Binary weighting could, for example, have the first current generator 20.1 passing a unit current I. The second current generator 20.2 would pass 2I, the third current generator 20.2 would pass 4I, the fourth generator would pass a current of 8I and so on.

Figure 2:
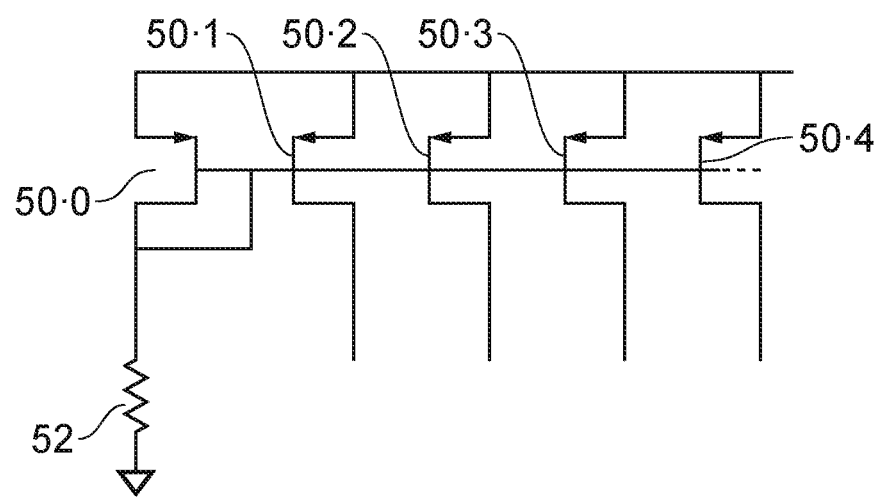
FIG. 2 is a circuit diagram illustrating how the current sources in FIG. 1 may be implemented.

FIG. 2 shows a possible representation of the current generators 20.1 to 20.4 being formed by P type field effect transistors. The transistors could be JFETs (as shown here), MOSFETS or any other FET variant. FETs are examples of transconductance devices where a voltage Vgs between a gate and a source of a device is converted into a channel current flowing between drain and source terminals of the device. The parameter relating the input voltage Vgs to the device current Ids is known as the transconductance $g_m$ of the transistor.

$$Ids = Vgs * g_m \qquad \text{Eqn 1}$$

The transconductance is known to vary with drain current, with gate-source voltage, and device parameters such as the threshold voltage. For transistors operating in a strong inversion regime (where Vgs−Vth<<Vds) it is measured that $$Id = K(Vgs-Vth)^2 \qquad \text{Eqn 2}$$

where K is a scaling factor.

Hence $gm = \delta Id/\delta Vin$ has a square root relationship with Id.

In the arrangement shown in FIG. 2 Vds may be quite large. The issue of gain variation is avoided by forming the current generators as part of a current mirror. A transistor 50.0 is placed in a diode connected configuration and in series with a current defining load, such as resistor 52. The gate voltage of the transistor 50.0 gets driven to whatever value is appropriate to pass the current flowing through transistor 50.0. This transistor can be regarded as acting as the "Master" of the current mirror. The gate voltage is then passed to the transistors 50.1, 50.2 50.3 and so on. The transistors would, if all of identical size, pass the same current. This feature can be exploited by varying the width to length ratio to cause the transistors to pass scaled versions of the current flowing in the master transistor 50.0. Suppose that the master transistor passes a current I. If all the transistors are formed with the same length and transistor 50.1 has the same width W as transistor 50.0, then transistor 50.1 passes I. If transistor 50.2 is formed with a width 2W (i.e a size of 2W*L) then it passes a current 2I, but also takes up twice as much area on the die. If transistor 50.3 is formed with a width 4W (i.e a size of 4W*L) then it passes 4I and takes four times the area of transistor 50.1. It can also be seen that if all of the transistors are formed of a unit size then connecting two transistors in parallel is equivalent to forming a double width transistor. Similarly connecting four transistors in parallel is equivalent to forming a transistor of width 4W and so on. Consequently if so desired the DAC can be formed of identical transistors and the scaling achieved by the way that the transistors are grouped in parallel to simulate larger transistors.

To avoid scaling errors, the transistors 50.0 and 50.1 need to be made sufficiently large that etching and other fabrication errors do not adversely affect the size of the transistors. However this mean that the other transistors are also correspondingly larger. For an 8 bit DAC the transistor associated with the most significant bit (MSB) would be 128 times the size of the transistor associated with the least significant bit (LSB). This is a significant size and cost penalty. For high resolution digital to analog converters such as 18 bit DACs the transistor passing the current for the most significant bit would be $2^{17}=131072$ times the width of the transistor associated with the least significant bit. This is impractical in terms of the area consumed by the transistors and the degree of matching required. The transistor sizes would need to be matched to 0.0007% to realise a single LSB error between the MSB and LSB transistors.

The present inventor realized that this size penalty need not be incurred in a current steering DAC. The inventor realized that if steps were taken to modify the transconductance of the FETs in the DAC then the size scaling between the transistors need not follow the DAC current ratios.

The inventor realized that there are ways to modify the transconductance of a field effect transistor in a reliable way. In current steering DACs most transistors are operated in a strongly inverted regime Vgs>Vt. This, as noted above, gives rise to gm being a function of the square-root of Ids.

However, the inventor realized that if a FET is operated in weak inversion or sub-threshold region, the transconductance can expressed as:

$$g_m = \frac{\partial I_d}{\partial V_{gs}} \approx I_{DO} \frac{W}{L} \frac{1}{nVt} e^{\left(\frac{Vgs}{nVt}\right)} = I_{DO}/nVt \qquad \text{Eqn 3}$$

Where:
$Vt=kT/q$ (K=Boltzmann's constant, T is temperature in Kelvin and q is the charge of an electron);
$I_{DO}$ is current at $V_{GS}=V_{TH}$ n is a slope factor approximated by $n=1+C_D/C_{OX}$ where $C_D$ is the capacitance of the depletion layer and $C_{OX}$ is the capacitance of the oxide layer.

Hence the transconductance has a linear relationship with Id.

Figure 3A:
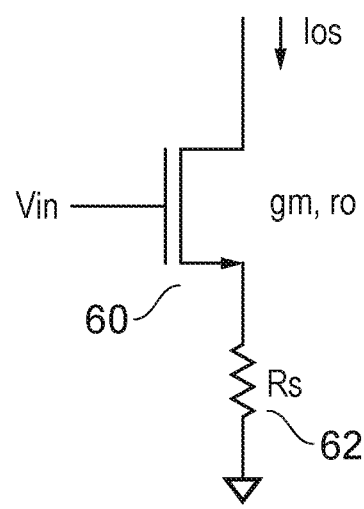
FIG. 3A and FIG. 3B compare the performance of a degenerated FET with a non-degenerated FET.
Figure 3B:
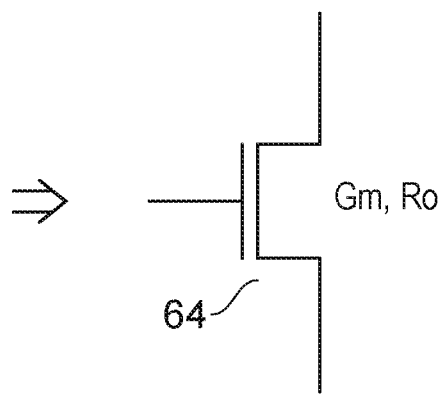

It is also known that the effective transconductance of a transistor can be reduced by the inclusion of a degeneration resistor. FIGS. 3A and 3B equate a FET 60 having transconductance gm and output impedance ro (which is 1/gm) in association with a source resistor 62 having a value Rs (which acts as a degeneration resistor), with an equivalent non-degenerated FET 64 having transconductance Gm and output impedance Ro.

It can be seen that $$Gm=gm*ro/Ro \qquad \text{Eqn 4}$$

$$Ro=Rs+ro+(gm*ro*Rs) \qquad \text{Eqn 5}$$

and consequently $$Gm=gm/(1+gmRs) \text{ if } gm*ro>>1 \qquad \text{Eqn 6}$$

and $$Gm\approx1/Rs \text{ if } gm*Rs<<1 \qquad \text{Eqn 7}$$

Thus for a given Vgs the current through a transistor can be controlled by modifying the effective transconductance Gm of the transistor by way of a source resistance, known as a degeneration resistor.

This ability to modify the transconductance of the FET in a reliable way can be exploited to allow the transistor sizes within a current steeling DAC to be modified and the relative size scalings changed. In an example of this disclosure the transistors are formed with the same W/L ratio, and can all be the same size.

Figure 4:
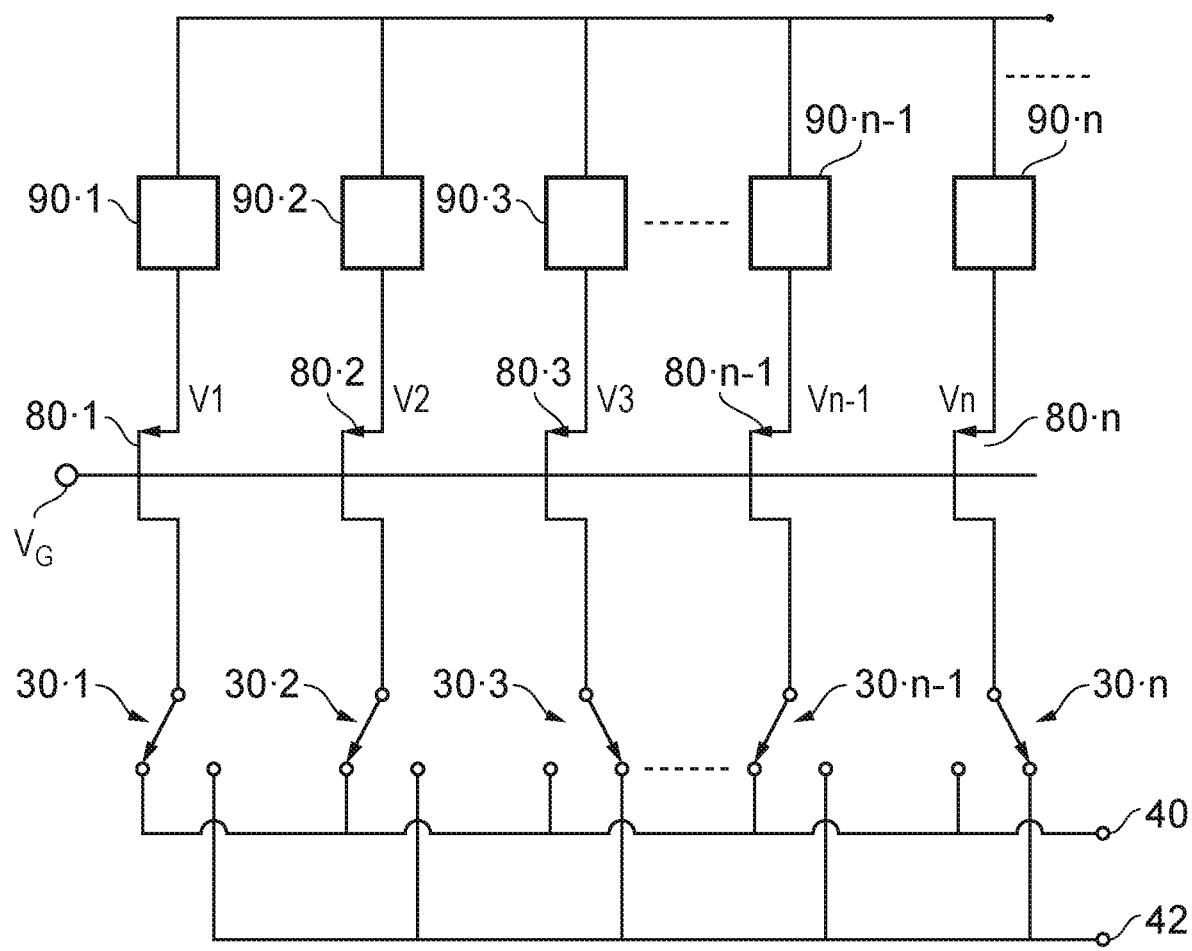
FIG. 4 is a schematic diagram of one topology of a DAC in accordance with the teachings of the present disclosure.

FIG. 4 shows an arrangement of transistors 80.1, 80.2, 80.3, ... 80.n–1 and 80.n each of which share the same gate voltage $V_G$ received from the voltage generator, such as a diode connected transistor like 50.0 shown in FIG. 2. The drains of each of the transistors are connected to respective current steering switches 30.1 to 30.n as described with respect to FIG. 1. However the source of each transistor is connected to a common supply rail Vdd by way of respective voltage modifying component 90.1 to 90.n. Each of these components modifies the voltage as seen at the source of the respective current control transistors 80.1 to 80.n of the current steering DAC. Thus, in operation the source of the first transistor 80.1 is at a voltage V1. The voltage at the source of the second transistor 80.2 is at V2, the source of the third transistor is at a voltage V3, and so on. In the arrangement shown in FIG. 4 each of the voltage copying components 90.1 to 90.n acts independently of all the others. As a consequence, the individual current flow transistors could be followed by a switch that selectively enables or disables current flow through that transistor and such an arrangement would not impact on all the respective source voltages of the other transistors.

Figure 5:
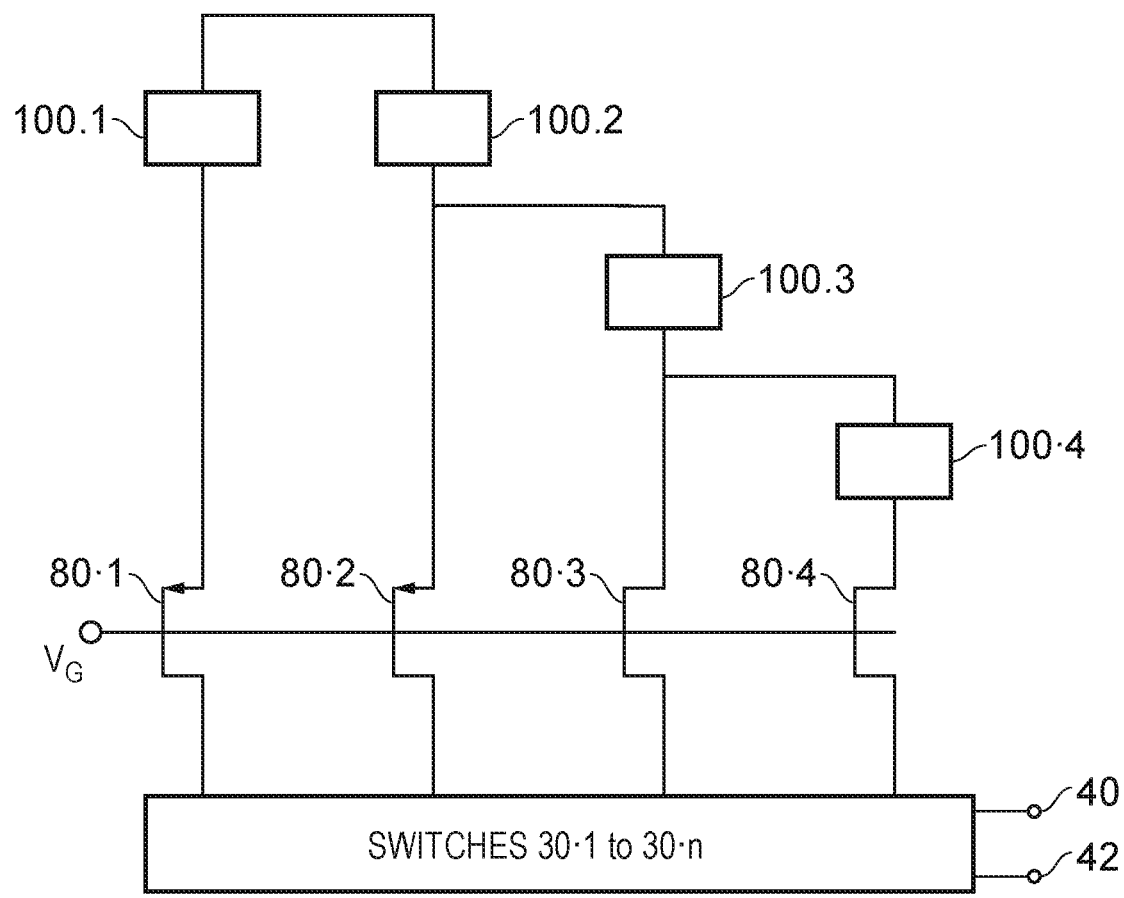
FIG. 5 is a schematic diagram of another topology of a DAC in accordance with the teachings of this disclosure.

FIG. 5 shows a modified configuration where each voltage modification component 100.1 to 100.4 causes a change which is provided both to its respective transistor and also to subsequent voltage modification components 100.2, 100.3, 100.4 and so on. In a cascading or ladder type arrangement.

In a first embodiment of the present disclosure, the transconductance of the transistors is modified by the inclusion of degeneration resistors.

Figure 6:
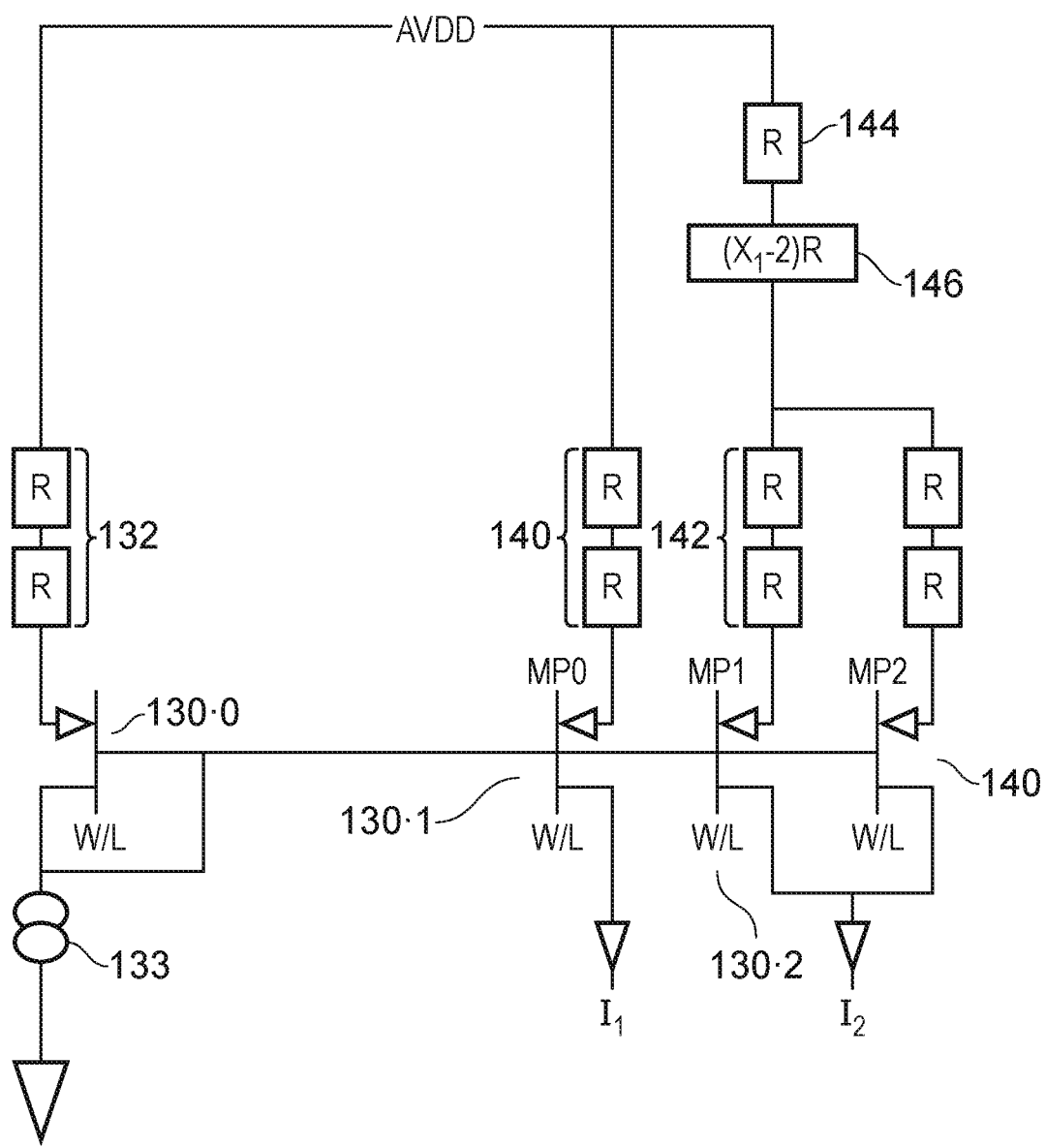
FIG. 6 is a circuit diagram of a DAC using degeneration resistors and in accordance with the teachings of this disclosure.

FIG. 6 shows an embodiment of the present disclosure where, for simplicity only the first two stages are shown. The DAC comprises a gate voltage generating stage, in the faun of a diode connected field effect transistor 130.0. The transistor 130.0 has a degeneration resistor 132 connected between its source and the positive supply rail Vdd. The degeneration resistor can be considered as having a value of 2R. The transistor passes a current that may be defined by another component, such as a current source 133 or a further resistor. The gate voltage of the diode connected transistor 130.0 is used to set the gate voltages of the current control transistors of the DAC, of which transistors 130.1, 130.2 and a terminating device 140 are shown.

The first current control transistor 130.1 is, in this example, set to pass a current I1 which is the same as the current flowing in the diode connected transistor 130.1. To do this, is also has a degeneration resistor 140 of value 2R.

Current control transistor 130.2 is "the next stage" and is used to pass a current I2 which is half of the current I1. As such its effective transconductance GM needs to be half that of transistor 130.1. So we need to work out a value of the degeneration resistance for "the next stage". The transistor 130.2 has its degeneration resistance formed of 3 components to facilitate the use of unit size resistors in the integrated circuit design and lay-out processes. The first degeneration component 142 is a degeneration resistor of value 2R. The second component is a resistor 144 of value R. The third component is a resistor 146 whose value is variable and is represented as $(X_1-2)R$. This component represents a modification to the notation used in R-2R resistor DACs.

Returning to FIG. 6, we can now invoke the idea of using the terminating transistor 140 to notionally be used to supply an additional current such that the current through the terminating transistor and "the next stage" (currently transistor 130.2) is equal to the current of the preceding stage (i.e. transistor 130.1).

With the terminating transistor considered to be in parallel with "the next stage" transistor, we can equate the gains between "the next stage" and its preceding stage.

So equating the degenerated GM of transistor 130.1 with the degenerated GM of transistors 130.2 and 140 in parallel, we can write, for the transistor 130.1 (MP0), $$I_{DS} = \frac{W}{L} I_S \exp\left(\frac{V_{G-Vdd} - I_{DS}2R - V_T}{nU_T}\right) \qquad \text{Eqn 8}$$

For the transistor 130.2 (MP2) which carries half the current, we can write $$\frac{I_{DS}}{2} = \frac{W}{L} I_S \exp\left(\frac{V_{G-Vdd} - I_{DS}(2+x)R - V_T}{nU_T}\right) \qquad \text{Eqn 9}$$

we can equate them as follows:

$$\frac{W}{L} I_S \exp\left(\frac{V_{G-Vdd} - I_{DS}2R - V_T}{nU_T}\right) = \qquad \text{Eqn 10}$$
$$\frac{2W}{L} I_S \exp\left(\frac{V_{G-Vdd} - I_{DS}(2+x)R - V_T}{nU_T}\right)$$

and simplified as follows $$\frac{V_{G-Vdd} - I_{DS}2R - V_T}{nU_T} = \ln(2) + \frac{V_{G-Vdd} - I_{DS}(2+x)R - V_T}{nU_T} \qquad \text{Eqn 11}$$

-continued $$\frac{V_{G-Vdd} - I_{DS}2R - V_T}{nU_T} - \frac{V_{G-Vdd} - I_{DS}(2+x)R - V_T}{nU_T} = \ln(2)$$

$$\frac{-I_{DS}2R}{nU_T} - \frac{-I_{DS}(2+x)R}{nU_T} = \ln(2)$$

$$-g_m 2R + g_m(2+x)R = \ln(2)$$

$$2 + x = \frac{\ln(2) + g_m 2R}{g_m R}$$

$$2 + x = \frac{\ln(2)}{g_m R} + 2$$

$$x = \frac{\ln(2)}{g_m R}$$

In this example it is worth noting that increasing input voltage results in decreasing channel current through the PMOS devices, so gm is negative. The same analysis can be performed for subsequent stages The designer is generally offered transistors with a nominal gm (subject to process, voltage and temperature variations) as part of the fabrication processes that they are offered and as such the designer can select the notional values of gm and R. This allows the value of X to be calculated.

Figure 7:
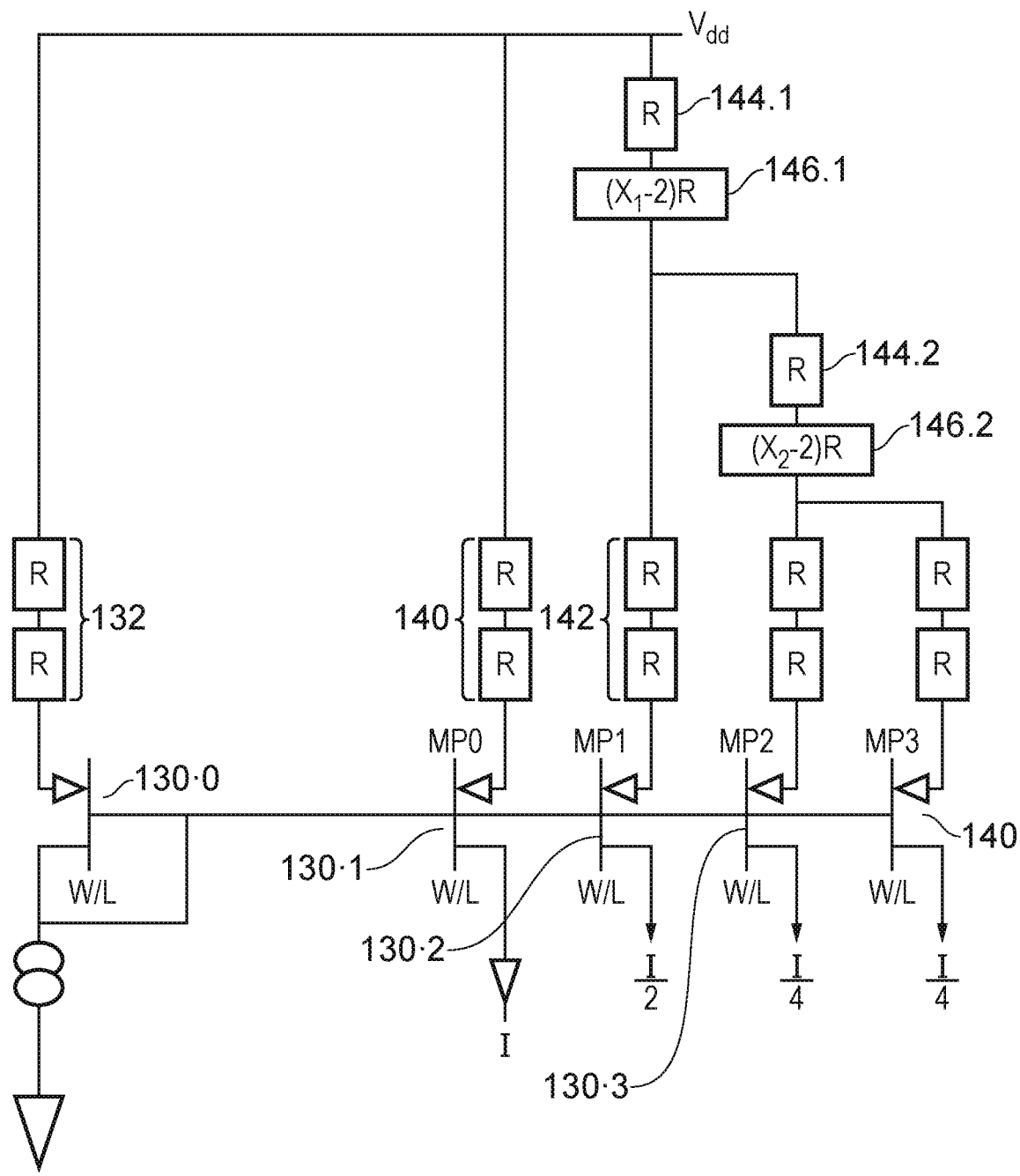
FIG. 7 shows a resistor based DAC constituting an embodiment of this disclosure in further detail.

Having looked briefly at the process for calculating the values FIG. 7 briefly shows how the values of the resistors can be calculated for a DAC of more than two stages. It can be seen that the value of the variable changeable component is $$\frac{\ln(2)}{g_m R} \cdot R$$

for the first stage (resistor 146.1), $X_1$ $$\frac{2\ln(2)}{g_m R} \cdot R$$

for the second stage (resistor 146.2), $X_2$
This continues as $$\frac{3\ln(2)}{g_m R} \cdot R$$

for the third stage, $X_3$ $$\frac{4\ln(2)}{g_m R} \cdot R$$

for the 4th stage, $X_4$

We can write a sequence such that $X_N = (N*\ln(2))/gmR))$     Eqn 12

Consequently if gm.R was selected to be equal to −6, then the variable degeneration resistance as seen "looking out" from the source of a stage transistor is
Stage 1=2.1155 R
Stage 2=2.2310 R Stage 3=2.3465 R
Stage 4=2.4621 R If one calculates the voltage at the source of the transistors MP0, MP1 and MP2 (using knowledge of the desired current flow from each transistor) it can be seen that the source voltages differ slightly, unlike the case of the classic R-2R ladder where the same calculation shows all of the source voltages to be identical.

Another approach to building a DAC where the transistors need not be binary scaled, and in fact can be of the same size, it to modify the source voltage by virtue of the voltage dropped across series connected transistors.

The scientific literature shows that the drain current of a FET can be expressed as $$I_D = [I_O \exp(qV_G/mkT)] \cdot [1 - \exp(-qV_D/kT)] \quad \text{Eqn 13}$$

Where
$I_O$=reverse diode leakage current
q=charge of an electron, $1.60217662 \times 10^{-19}$ coulombs
K=Boltzmann's constant, $1.38064852 \times 10^{-23}$ m² kg s⁻² K⁻¹
T=temperature in Kelvin
VG=Gate-source voltage
VD=drain source voltage
m is a sub-threshold slope factor.

For convenience q/KT is approximately 40 at room temperature.

Figure 8:
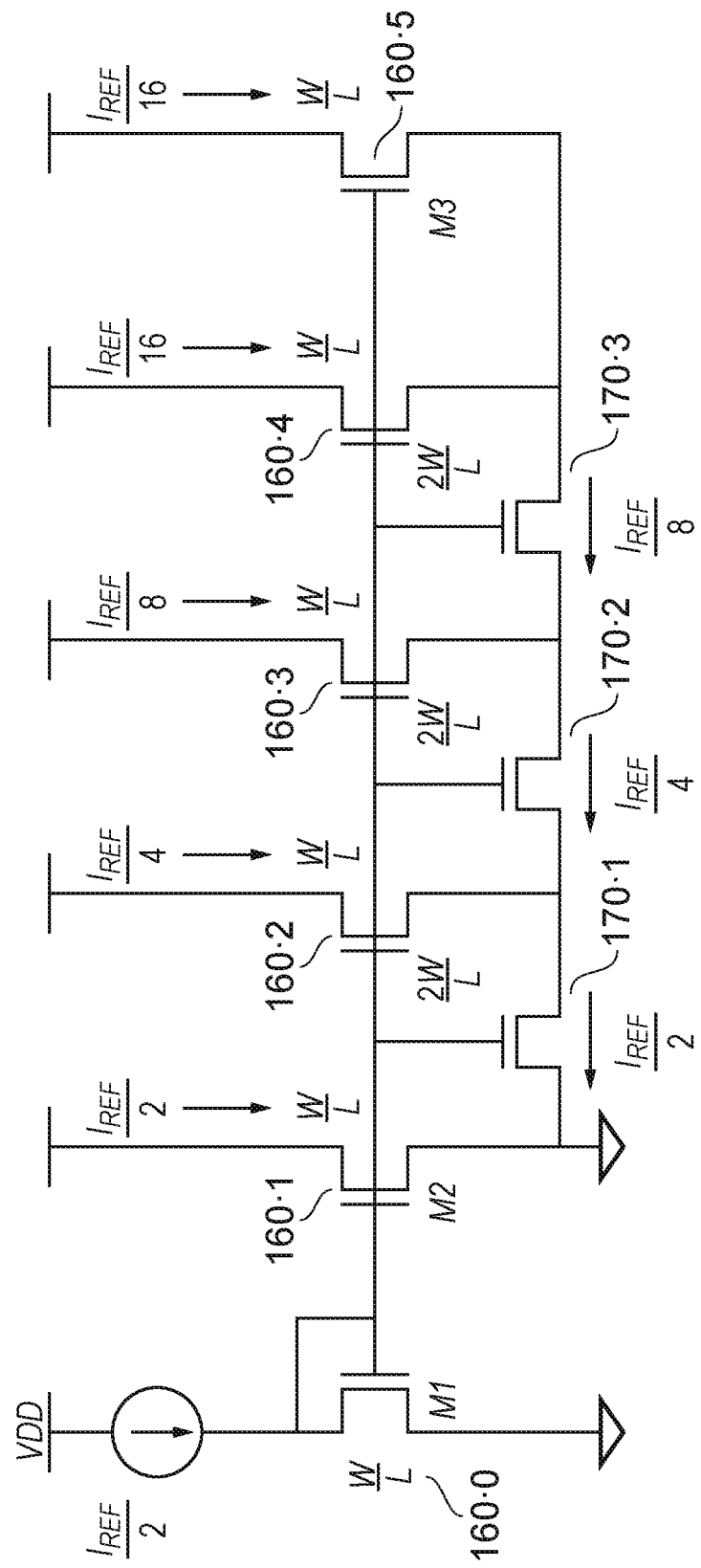
FIG. 8 is a schematic diagram of a W-2W DAC.

The arrangement shown in FIG. 8 is a modification of a W-2W current steering DAC architecture, for example as discussed in the paper "W-2W current steering DAC for programming phase change memory", Shantanu Gupta, Vishal Saxena, Kirsty A. Campbell and R. Jacob Baker (available for download at: http://citeseerx.ist.psu.edu/viewdoc/download?doi=10.1.1.331.3899&rep=rep1&type=pdf).

A W-2W DAC approach is illustrated in FIG. 8. Here diode connected master transistor 160.0 is arranged to pass a current Iref/2. The gate voltage of the master transistor 160.0 is supplied to the gates of each of the slave transistors 160.1, 160.2, 160.3, 160.4 and 160.5. Each of the transistors 160.1 to 160.5 is the same size. The source of the first slave transistor 160.1 is connected directly to the local ground, and hence it passes Iref/2. The current passing through each of the transistors 160.2 to 160.5 is arranged to pass via a current control transistor 170.1 whose gate is also receives the gate voltage of the diode connected transistor with a width 2W/L. The drain of the transistor 170.1 is connected to the source of transistor 160.2 and the source of double width transistor 170.2. The drain of transistor 170.2 is connected to the source of transistor 160.3 and the source of double width transistor 170.3. The drain of transistor 170.3 is connected to the source of the transistor 160.4 and the source of the terminating transistor 160.5. The gates of the transistors 170.2 and 170.3 are connected to receive the gate voltage of the master transistor 160.0.

In this arrangement transistor 170.1 seeks to pass a current IRef/2, which is provided by way of transistors 160.2 and 170.2 The gate voltages of the transistors 160.2 and 170.2 are identical, and hence the current is split equally between the two paths that these transistors are in. Consequently transistor 160.2 passes Iref/4. Similarly transistor 160.3 passes Iref/8 and transistors 160.4 and 160.5 pass Iref/16 each.

This works in a situation where the gate voltage is much higher than the threshold voltage and hence the drain-source voltage drop across the transistors 170.1 to 170.3 can be ignored. However, this approach of W-2W scaling begins to fail as the supply voltage drops as is the case with deep sub-micron fabricated devices or where the currents that are to be passed are so small that sub-threshold operation is required. However the inventor realized that with modified resealing, the same topology could be used with transistors operating below their threshold voltages.

Figure 9:
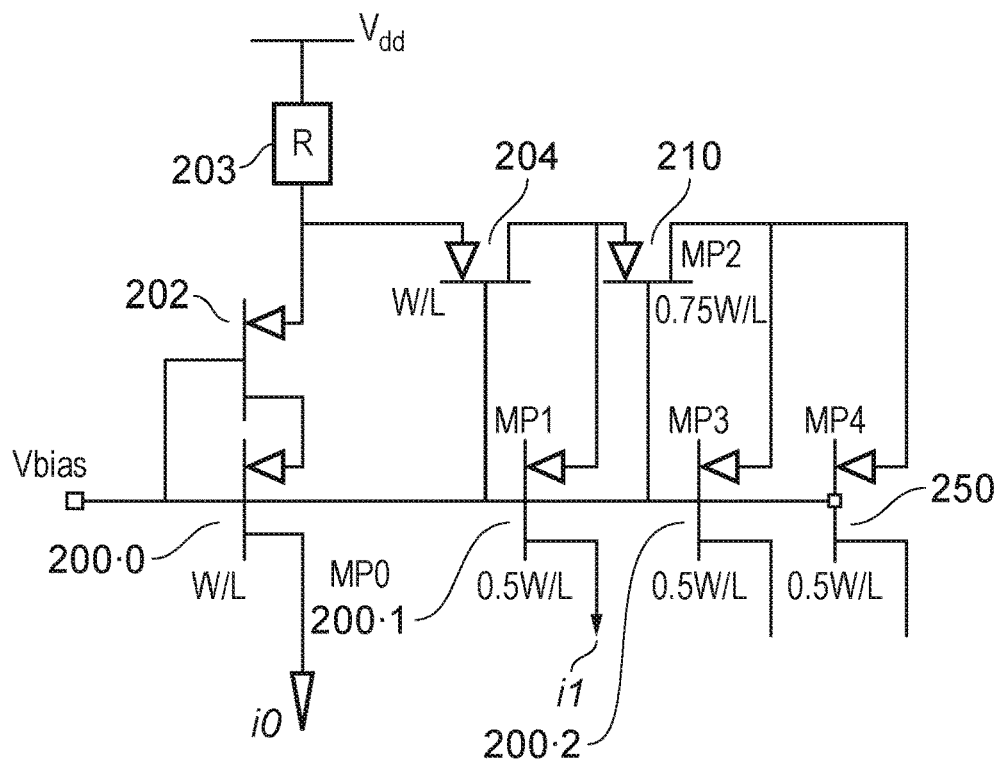
FIG. 9 shows a current steering DAC constituting an embodiment of the present disclosure.

In the arrangement shown in FIG. 9, P type transistors 200.1, 200.1, 200.2, 250, 202 and 210 each have their gates connected to a shared bias voltage Vbias, which may be generated by the gate voltage of a diode connected P type transistor, such as transistor 130.0 of FIG. 7.

Transistors 202 and 200.0 are connected in series with each other and with a resistor 203. A source of transistor 204 is connected to the source of transistor 203. The drain of transistor 204 is connected to the source of transistor 200.1 and the source of transistor 210. The drain of transistor 210 is connected to the sources of transistors 200.2 and 250.

The transistors 200.0, 202 and 204 all have the same width to length ratio W/L. The transistors 200.1, 200.2 and 250 in this example are scaled to 0.5 W/L so seek to pass half the current of transistor 200.0. The sum of the current flowing through the transistors 200.2 and 250 is selected to match the current flowing through transistor 200.1. From this it can be seen that the current flowing through transistor 204 is identical to that flowing through transistor 202 and hence the gate-source voltages of transistors 200.0 and 200.1 are identical. As a result the width scaling between transistors 200.0 and 200.1 works to have transistor 200.1 passing half the current of transistor 200.0, i.e. I1=I0/2.

We want transistor 200.2 to pass I2=I0/4. In the prior art transistor 210 would have had a size W/L but in the arrangement shown a different size, 0.75 W/L is selected.

Figure 10:
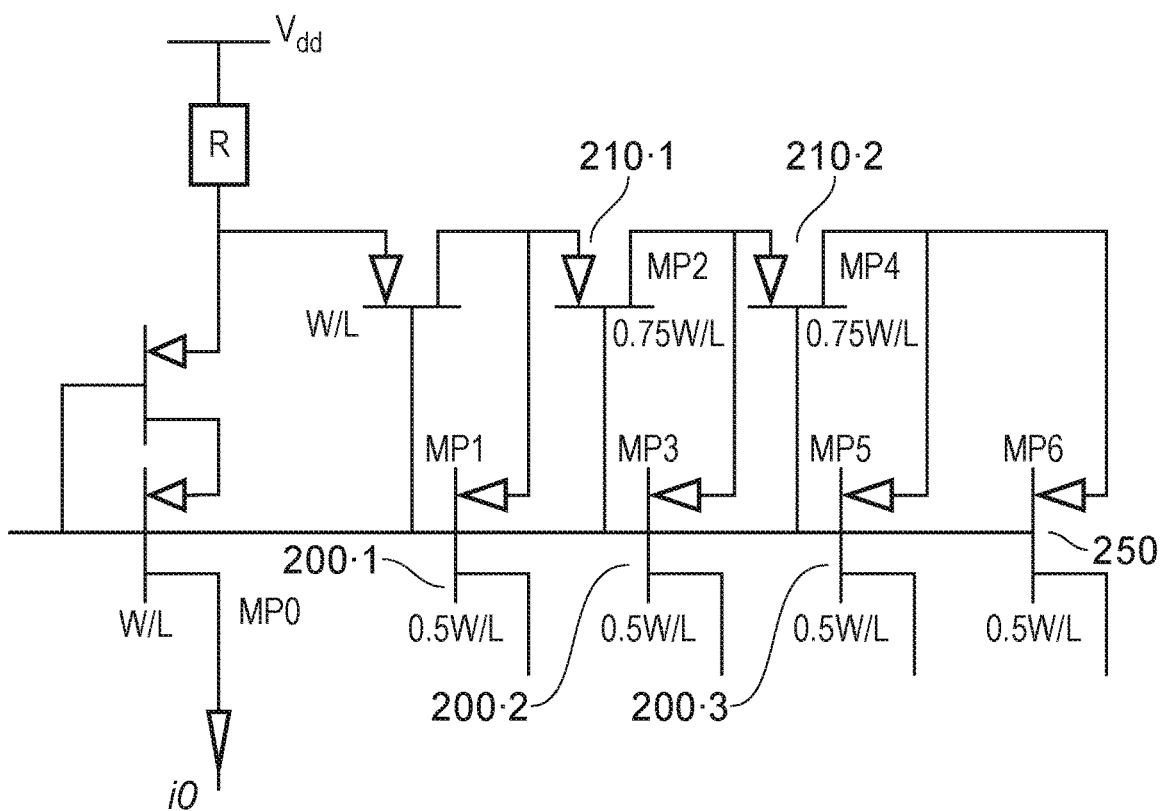
FIG. 10 shows a further current steering DAC constituting an embodiment of the present disclosure.

In this circuit we want the current to scale such that the current in transistor 200.2 is half that of the current in transistor 200.1. Furthermore if we add further transistors, such as transistor 200.3 in FIG. 10 then the current through that transistor needs to be half of the current through transistor 200.2. We know from the literature that the current through a FET operating in its sub-threshold regime can be expressed as $$I_D = \left[I_O \exp\left(\frac{qV_{GS}}{mkT}\right)\right] \cdot \left[1 - \exp\left(-\frac{qV_{DS}}{kT}\right)\right] \quad \text{Eqn 14}$$

And if we allow for aspect ratio scaling we can add a further term W/L $$I_D = \left[I_O \exp\left(\frac{qV_{GS}}{mkT}\right)\right] \cdot \left[1 - \exp\left(-\frac{qV_{DS}}{kT}\right)\right] \cdot \left[\frac{W}{L}\right] \quad \text{Eqn 15}$$

If we look at the second term it can be seen that it tends to unity very quickly with increasing $V_{DS}$. In fact it can be seen that evaluating the exponential part $\exp(-V_{DS}*q/kT)$ gives a value of $4.5 \times 10^{-4}$ V at $V_{DS}$=0.2V and of $9.6 \times 10^{-6}$ V at $V_{DS}$=0.3V. Therefore as long as the circuit connected to the drains of the transistors holds a suitable voltage, such as of 0.3V across them (given that the source voltage for each transistor can be controlled by the current mirror circuit) then the second term can be ignored.

This allows us to simplify the expression to $$I_D = \left[I_O \exp\left(\frac{qV_{GS}}{mkT}\right)\right] \cdot \left[\frac{W}{L}\right] \quad \text{Eqn 16}$$

And if we decide to keep the aspect ratio of each of the transistors 200.1 to 200.n the same, then we can drop the W/L term too. This further simplified equation can be rewritten in terms of Vg by dividing by $I_O$ and then taking logarithms of both sides to get $$\text{Ln}\left(\frac{I_D}{I_O}\right) = \frac{q}{kT} \cdot \frac{Vg}{m} \qquad \text{Eqn 17}$$

So $$Vg = m \cdot \frac{kT}{q} \cdot \text{Ln}\left(\frac{I_D}{I_O}\right) \qquad \text{Eqn 18}$$

This is relevant as is shows that if we want to keep scaling the current from one stage to a subsequent one, for example by 0.5 then the voltage Vgs from stage to stage decreases monotonically, i.e. the size of the voltage change remains the same. Suppose we plot relative current as a multiple if $I_0$ through a transistor, as shown below:

| Relative current | Vgs | difference |
|---|---|---|
| 128 | 0.126 | |
| 64 | 0.108 | 0.018 |
| 32 | 0.090 | 0.018 |
| 16 | 0.072 | 0.018 |
| 8 | 0.054 | 0.018 |
| 4 | 0.036 | 0.018 |
| 2 | 0.018 | 0.018 |

For each halving of the current the voltage drops by 0.018V (assuming m=1).

In fact returning to the above equation we can see that each halving of current is expressed as a change in $V_{GS}$ from one transistor 200.1 to the next 200.2 and so on as:

$$dV_{GS} = m*kT/q. \; Ln(2) = 0.69 \; m/38.2 \; \text{(at 300K)}. \qquad \text{Eqn 19}$$

To set this voltage drop across transistors 210.1 (although this same analysis applies to transistor 210.2 and any further transistors to 210.n) we know that Vgs for transistor 200.1 is identical to Vgs for transistor 210.1 (their gates are tied together and their sources are tied together). This means that the first terms in the expressions for Id are the same for both devices. We also want the transistors to pass the same current. This means that the second term and the aspect ratio term becomes important.

For transistor 200.1 we had already established that it was in saturation, i.e Vds sufficiently big that the second term evaluated to unity, i.e.

$$\left[1 - \exp\left(-\frac{qV_{DS}}{kT}\right)\right] = 1 \qquad \text{Eqn 20}$$

So for the transistor 210.1 we can write $$\left[1 - \exp\left(-\frac{qV_{DS}}{kT}\right)\right]*x = 1 \qquad \text{Eqn 21}$$

Where x represents the aspect ratio W/L
We know Vds so can substitute in to Eqn 21 to get $$\left[1 - \exp\left(-\frac{q}{kT} \cdot m \cdot \frac{kT}{q} \cdot \text{Ln}(2)\right)\right]*x = 1 \qquad \text{Eqn 22}$$

So $$[1 - \exp(-0.69m)]x = 1 \qquad \text{Eqn 23}$$

Or $$x = \frac{1}{1 - \exp(-0.69m)} \qquad \text{Eqn 24}$$

The value of m depends on the fabrication process and would be 1 for an ideal device but for real devices lies between 1.1 and 1.5, but is known.

At this point it is worth noting that the linking transistors 210.1, 210.2, and so on are not in saturation whereas in prior art W2W devices all the transistors are saturated.

In fact Equation 24 was derived for a scaling factor of 2 (Ln(2)=0.69) but can be expressed for an arbitrary scaling factor D as $$x = \frac{1}{1 - \exp(-m \cdot \ln(D))} \qquad \text{Eqn 25}$$

If m=1.5 then x is about 1.5, so transistors 210.1, 210.2 being half size transistors of side 0.5 W/L result in the transistors 210.1 and 210.2 having a size of 0.5 W/L*1.5=0.75 W/L.

If m=1.2 then x becomes about 1.75 and the transistors 210.1 to 210.n would have a size of 0.5 W/L*1.75=0.875 W/L.

Figure 11:
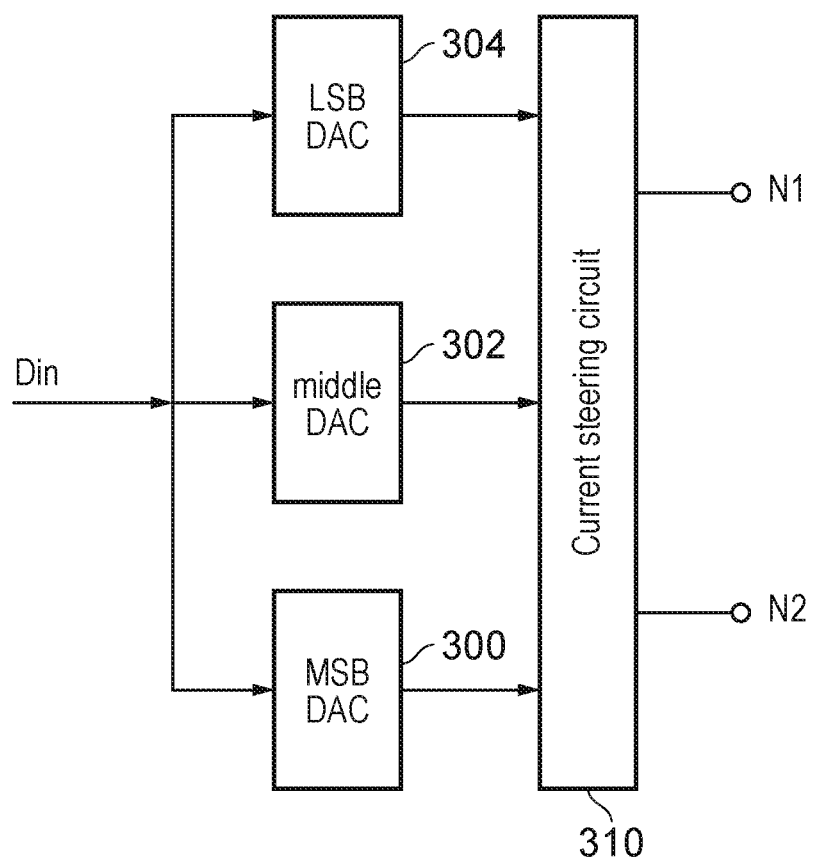
FIG. 11 shows a DAC comprising three sub-DACs working in unison to form a high resolution DAC.

The DAC configurations described can be used together, for example with the resistor degenerated DAC acting to supply larger currents than the DAC involving the series voltage dropping transistors. These DACs may be arranged to work together to foiin a DAC or may further be arranged to work with a scaled transistor DAC, as described with respect to FIGS. 1 and 2. In which case, and as shown on FIG. 11, each DAC variant may cover a respective portion of the output word. The scaled transistor DAC 300 can be arranged to provide current representing the largest significant bits of the input word, the resistor degenerated DAC 302 covers the mid-range bits of the word, and the DAC 304 with the series voltage dropping transistors converts the least significant bit so of the input word. The currents from the DACs are steered by a current steering circuit 310 to nodes N1 or N2.

Returning to Equation 19 and the table that precedes it, it can be seen that it can be seen that we are free to select any scaling between adjacent current outputs. For example we may seek a scaling of less than 2 to ensure that the DAC does not have any missing codes. We can also build logarithmic DACs where, for example, each output differs from its neighbour be a known scaling factor greater than 2, for example by a factor of 10, as set out below:

| Relative current | Vgs | difference |
|---|---|---|
| 1000000 | 0.359 | |
| 100000 | 0.299 | 0.060 |
| 10000 | 0.239 | 0.060 |
| 1000 | 0.179 | 0.060 |
| 100 | 0.120 | 0.060 |
| 10 | 0.060 | 0.060 |
| 1 | 0.000 | 0.060 |

Now we want the link transistor to ⅑th of the current passed by the preceding stage. This means Equation 19 becomes modified to $$[1-\exp(-m \cdot ln(10))]x = 1/9 \quad \text{Eqn 26}$$

For m=1.5 this gives x of approximately 0.11.

Figure 12:
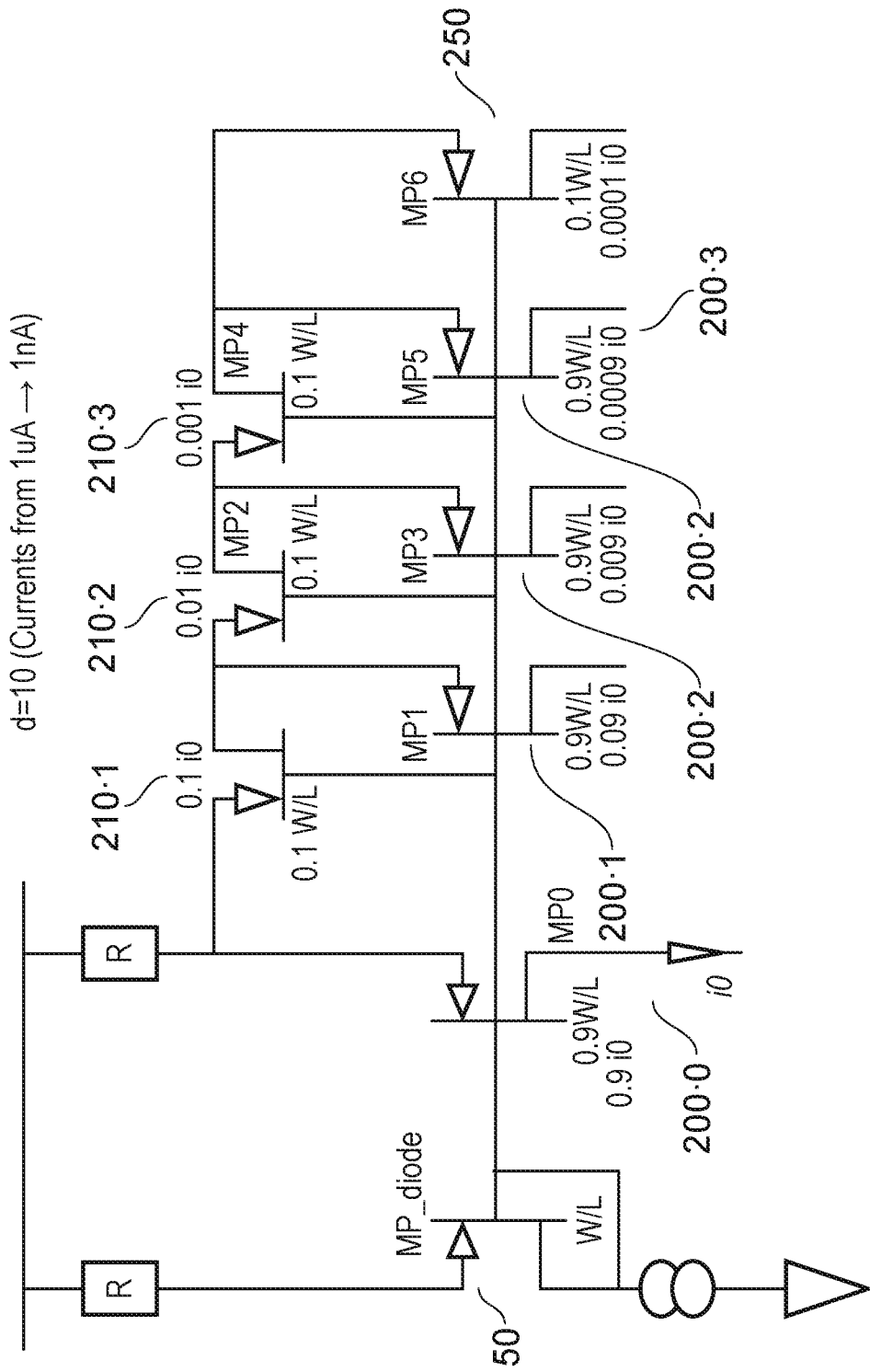
FIG. 12 shows a further embodiment of a DAC in accordance with the teachings of the present disclosure.

FIG. 12 is a circuit diagram of a DAC current generating circuit where, compared to the master transistor 50.0, all of the current control transistors 200.0 to 200.3 have the same size 0 f 0.9 W/L. Each of the series connected linking transistors 210.1 to 210.3 has a size of 0.1 W/L.

Taking the current through the master transistor 50 as I0, it can be seen that the first slave/current control transistor 200.1 passes 0.9 I0, the second transistor 200.1 passes 0.09 I0, the third transistor 200.2 passes 0.009 I0 and so on.

It is this possible to provide high resolution DAC converters having good linearity. The current steering DACs presented here have an advantage over R-2R resistor based DAC arrays in that the intermediate nodes within the current steering DACs are not subject to voltage changes during DAC code changes. As such output from the DAC settles quickly and is generally glitch free. In order to do this the current steering switches (which are implemented by pairs of FETs driven as switches) are switched in a make before break mode. This contrasts with R-2R DACs where code changes give rise to voltage fluctuations at internal nodes which charge parasitic capacitors associated with those nodes. The resistive DAC needs time to settle before its output becomes valid. Also, the outputs of R-2R can be glitchy.

The current steering DACs disclosed herein can be used across many applications, including industrial control, healthcare, aerospace, entertainment and automotive sectors. This list is not limiting.

The claims presented herein are in single dependency format suitable for filing at the USPTO, but it is to be understood that any claim may depend on any preceding claim unless that is clearly technically infeasible.

The invention claimed is:

1. A digital to analog converter comprising:
a plurality of field effect transistors configured as current generators and arranged in an array, wherein:
a first transistor of the plurality of field effect transistors has a first effective transconductance and outputs a first current by a first terminal of the first transistor of an amount that differs from a second current output by a second terminal of a second transistor of a set of field effect transistors in the plurality of field effect transistors, the second transistor having a second effective transconductance that differs from the first effective transconductance, and
the first and second transistors are operated at sub threshold gate-source voltages, the first terminal being selectively coupled to the second terminal;
a first resistor in a first current path of the set of field effect transistors to establish values of respective currents output by terminals of the set of field effect transistors, the first resistor being coupled via separate resistors to each field effect transistor in the set of field effect transistors, where the terminals of the set of field effect transistors are selectively coupled to the first terminal of the first transistor; and
a second resistor in a second current path of the first transistor and coupled to a third terminal of the first transistor to establish a value of the first current, the first resistor being coupled to the third terminal of the first transistor via the second resistor, the first and second current paths separately coupled to a common supply node, and current flows through the second resistor in the second current path separately from the first resistor in the first current path.

2. A digital to analog converter as claimed in claim 1, in which the array has a plurality of current outputs, and wherein each output is supplied by a respective current generator formed of a respective field effect transistor, and wherein each transistor is in series with a source voltage modification component or circuit, wherein a resistance value of the first resistor is selected during manufacture of the digital to analog converter based on the second effective transconductance of the second transistor and the first current output by the first transistor.

3. A digital to analog converter as claimed in claim 2 in which the voltage modification components or circuits are arranged in series, with a first voltage modifying component or circuit supplying a modified voltage to a second voltage modifying component or circuit.

4. A digital to analog converter as claimed in claim 3 where the voltage modification components include resistors connected to the source of the respective field effect transistors, the resistors being arranged in a modified R-2R ladder configuration with the resistor ratios differing from an R-2R configuration, and wherein the values of the resistors in the ladder configuration are modified from that of an R-2R ladder configuration to take account of the transconductance of the respective field effect transistors.

5. A digital to analog converter as claimed in claim 1, further comprising a power supply line, wherein the plurality of field effect transistors of the digital to analog converter correspond to a common digital input, and wherein the first resistor is separate from the power supply line and is coupled between the power supply line and a fourth terminal of the second transistor.

6. A digital to analog converter as claimed in claim 1 in which the first transistor configured as a first current source has a degeneration resistor of value 2R (where R is an arbitrary value), and the second transistor configured as a second current source that outputs the second current half that of the first current output by the first transistor and has a source resistance comprised of a first part that is only in a current flow path to the second transistor and has a value 2R and a second part which is in the current flow path with the second transistor and a further load that draws a current equal to the second current passed by the second transistor and has a value of $R+(X_1-2)R$, where $X_1$ is selected such that the second transistor carries half the first current of the first transistor.

7. A digital to analog converter as claimed in claim 6, in which $X_1=(\ln(2))/gmR)$), further comprising a third transistor configured as a third current source that outputs a current half that of the second transistor and has a source resistance comprised of a first part that is only in a current flow path to the third transistor and has a value 2R and a second part which is in the current flow path with the third transistor and a further load that draws a current equal to the current passed by the third transistor and has a value of $R+(X2-2)R$, wherein $X2=(2\ln(2))/gmR)$).

8. A digital to analog converter as claimed in claim 6, in which an Nth transistor acting as a Nth current source has a degeneration resistor comprised of a first part that is only in a current flow path to the Nth transistor and has a value 2R and a second part which is in the current flow path with the Nth transistor and a further load that draws a current equal to the current passed by the Nth transistor and has a value of $R+(X_N-2)R$, where $X_N=(N\ln(2))/gmR)$).

9. A digital to analog converter as claimed in claim 1 in which each current source has the gate-source voltage of the respective field effect transistor modified by modification device comprising a series connected field effect transistor whose aspect ratio is selected to be between 1.3 and 1.9 times the aspect ratio of the respective field effect transistor acting as a current generator, said selection being made on the basis of a sub-threshold slope factor m associated with the transistors.

10. A digital to analog converter as claimed in claim 9 in which the modification devices comprising respective field effect transistors are arranged in a cascade such that a first modification device supplies current to its respective current generator and to a subsequent modification device, where the output currents from a current generator are in the range of pica-amperes to micro-amperes.

11. A digital to analog converter as claimed in claim 1 in which each current source has the gate-source voltage of the respective field effect transistor modified by modification device comprising a series connected field effect transistor whose aspect ratio is selected to be between 7 and 9.5 times the aspect ratio of the respective field effect transistor acting as a current generator.

12. A digital to analog converter as claimed in claim 1, wherein the first resistor is an active or passive component which causes the second current to differ from the first current by a specified amount, wherein the first terminal of the first transistor is coupled to a first switch, wherein the second terminal of the second transistor is coupled to a second switch, wherein the first terminal is coupled to the second terminal when the first and second switches direct currents from the first and second terminals to a common given node.

13. A digital to analog converter comprising a plurality of sub-converters acting together to supply a current output, where a first one of the sub-converters comprises an array of transistors whose aspect ratios vary in proportion to the current provided by the respective transistors and one sub-converter comprises at least one DAC array as claimed in claim 1.

14. A digital to analog converter as claimed in claim 13, where the digital to analog converter has a second sub-converter comprising an array of transistors connected to a chain of degeneration resistors, and a third sub-converter comprising an array of transistors connected to a chain of voltage dropping field effect transistors.

15. A method comprising:
generating a first current by a first transistor of a plurality of field effect transistors of a digital to analog converter, wherein the first transistor has a first effective transconductance, and wherein the plurality of field effect transistors are configured as current generators and arranged in an array, wherein a first terminal of the first transistor outputs the first current; and
generating a second current by a second transistor of a set of field effect transistors in the plurality of field effect transistors of the digital to analog converter, the second transistor having a second effective transconductance that differs from the first effective transconductance, wherein a second terminal of the second transistor outputs the second current, wherein:
the first and second transistors operate at sub threshold gate-source voltages such that the first and second currents differ as a function of the first and second effective transconductances of the first and second transistors;
a first resistor is in a first current path of the set of field effect transistors to establish values of respective currents generated by terminals of the set of field effect transistors, the first resistor being coupled via separate resistors to each field effect transistor in the set of field effect transistors, where the terminals of the set of field effect transistors are selectively coupled to the first terminal of the first transistor; and
a second resistor is in a second current path of the first transistor and coupled to a third terminal of the first transistor to establish a value of the first current the first resistor being coupled to the third terminal of the first transistor via the second resistor, the first and second current paths separately coupled to a common supply node, and current flows through the second resistor in the second current path separately from the first resistor in the first current path.

16. The method of claim 15, wherein the second current is a fraction of the first current, and wherein the first transistor is configured as a first current source being associated with a first resistance of a given value, and wherein the second transistor is configured as a second current source being associated with a second resistance, the second resistance comprised of a first part having a third resistance of the given value and that is only in a current flow path to the second transistor and a second part which is in the current flow path with the second transistor and a fourth resistance, the fourth resistance having a value that is a function of the given value of the first resistance and the fraction.

17. The method of claim 15, wherein the array has a plurality of current outputs, and wherein each output is supplied by a respective current generator formed of a respective transistor, and wherein each transistor is in series with a source voltage modification component or circuit, further comprising coupling the voltage modification components or circuits in series, wherein a first voltage modifying component or circuit supplies a modified voltage to a second voltage modifying component or circuit.

18. The method of claim 17, where the voltage modification components include resistors connected to the source of the respective transistors, the resistors being arranged in a modified R-2R ladder configuration with the resistor ratios differing from an R-2R configuration.

19. The method of claim 15, wherein the first resistor is an active or passive component which causes the second current to differ from the first current by a specified amount.

20. The method of claim 15, wherein the first and second transistors correspond to a common digital input, and wherein the resistor is separate from a power supply line and is coupled between the power supply line and a fourth terminal of the second transistor, wherein the first terminal of the first transistor is coupled to a first switch, wherein the second terminal of the second transistor is coupled to a second switch, and wherein the first terminal is coupled to the second terminal when the first and second switches direct currents from the first and second terminals to a common given node.

21. The method of claim 15, wherein the first transistor has a degeneration resistor of value 2R (where R is an arbitrary value), wherein the second transistor generates the second current half that of the first current generated by the first transistor and has a source resistance comprised of a first part that is only in a current flow path to the second transistor and has a value 2R and a second part which is in the current flow path with the second transistor and a further load that draws a current equal to the second current passed by the second transistor and has a value of $R+(X_1-2)R$, where $X_1$ is selected such that the second transistor carries half the first current of the first transistor.

22. A digital to analog converter apparatus comprising:
circuitry for coupling a first resistor in a first current path of a set of field effect transistors in a plurality of field effect transistors of a digital to analog converter to establish values of respective currents generated by terminals of the set of field effect transistors, the first resistor being coupled via separate resistors to each field effect transistor in the set of field effect transistors, wherein:
the plurality of field effect transistors is configured as current generators and arranged in an array,
a first current is generated by a first transistor of the plurality of field effect transistors and the first current is output by a first terminal of the first transistor,
a second current is generated by a second transistor of the set of field effect transistors and the second current is output by a second terminal of the second transistor,
the terminals of the set of field effect transistors are selectively coupled to the first terminal of the first transistor,
the first and second transistors have different effective transconductances, and
the first and second transistors operate at sub threshold gate-source voltages such that the first and second currents differ as a function the effective transconductances of the first and second transistors; and
circuitry for coupling a second resistor in a second current path of the first transistor and for coupling the second resistor to a third terminal of the first transistor to establish a value of the first current, the first resistor being coupled to the third terminal of the first transistor via the second resistor, the first and second current paths being separately coupled to a common supply node, and current flows through the second resistor in the second current path separately from the first resistor in the first current path.

23. The digital to analog converter apparatus of claim 22, wherein the first resistor has a value that is based on the effective transconductance of the second transistor and the first current output by the first transistor, and wherein a resistance value of the first resistor is selected during manufacture of the digital to analog converter based on the effective transconductance of the second transistor and the first current output by the first transistor.

24. The digital to analog converter apparatus of claim 22, wherein the first transistor has a degeneration resistor of value 2R (where R is an arbitrary value), wherein the second transistor generates the second current half that of the first current generated by the first transistor and has a source resistance comprised of a first part that is only in a current flow path to the second transistor and has a value 2R, and a second part which is in the current flow path with the second transistor and a further load that draws a current equal to the second current passed by the second transistor and has a value of $R+(X_1-2)R$, where $X_1$ is selected such that the second transistor carries half the first current of the first transistor.

25. The digital to analog converter apparatus of claim 22, wherein the first resistor is an active component which causes the second current to differ from the first current by a specified amount.

26. The digital to analog converter apparatus of claim 22, wherein the first resistor is a passive component which causes the second current to differ from the first current by a specified amount, wherein the first terminal of the first transistor is coupled to a first switch, wherein the second terminal of the second transistor is coupled to a second switch, and wherein the first terminal is coupled to the second terminal when the first and second switches direct currents from the first and second terminals to a common given node.

* * * * *

UNITED STATES PATENT AND TRADEMARK OFFICE
CERTIFICATE OF CORRECTION

PATENT NO. : 10,615,817 B2
APPLICATION NO. : 15/895661
DATED : April 7, 2020
INVENTOR(S) : Fergus John Downey Page 1 of 1

It is certified that error appears in the above-identified patent and that said Letters Patent is hereby corrected as shown below:

In Column 12, Line 5, in Claim 2, delete "A" and insert --The-- therefor

In Column 12, Line 15, in Claim 3, delete "A" and insert --The-- therefor

In Column 12, Line 20, in Claim 4, delete "A" and insert --The-- therefor

In Column 12, Line 29, in Claim 5, delete "A" and insert --The-- therefor

In Column 12, Line 36, in Claim 6, delete "A" and insert --The-- therefor

In Column 12, Line 50, in Claim 7, delete "A" and insert --The-- therefor

In Column 12, Line 60, in Claim 8, delete "A" and insert --The-- therefor

In Column 13, Line 1, in Claim 9, delete "A" and insert --The-- therefor

In Column 13, Line 10, in Claim 10, delete "A" and insert --The-- therefor

In Column 13, Line 16, in Claim 10, delete "pica-amperes" and insert --pico-amperes-- therefor In Column 13, Line 18, in Claim 11, delete "A" and insert --The-- therefor In Column 13, Line 25, in Claim 12, delete "A" and insert --The-- therefor In Column 13, Line 42, in Claim 14, delete "A" and insert --The-- therefor In Column 14, Line 11, in Claim 15, after "current", insert --,--

In Column 16, Line 16, in Claim 24, delete "2R," and insert --2R-- therefor

Signed and Sealed this
Twenty-first Day of July, 2020

Andrei Iancu
*Director of the United States Patent and Trademark Office*